US006853970B1

(12) United States Patent
Gupta et al.

(10) Patent No.: US 6,853,970 B1
(45) Date of Patent: Feb. 8, 2005

(54) AUTOMATIC DESIGN OF PROCESSOR DATAPATHS

(75) Inventors: Shail Aditya Gupta, Sunnyvale, CA (US); B. Ramakrishna Rau, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/378,596

(22) Filed: Aug. 20, 1999

(51) Int. Cl.$^7$ .......................... G06F 9/44; G06F 13/10; G06F 13/12

(52) U.S. Cl. ............................. 703/20; 703/1; 703/22; 716/1; 716/4; 716/7

(58) Field of Search .............................. 703/1, 20, 22; 716/1–18

(56) References Cited

U.S. PATENT DOCUMENTS

| | | | | |
|---|---|---|---|---|
| 5,502,645 A | * | 3/1996 | Guerra et al. ................ | 714/733 |
| 5,513,123 A | * | 4/1996 | Dey et al. .................... | 714/724 |
| 5,530,884 A | * | 6/1996 | Sprague et al. ............... | 341/67 |
| 5,831,991 A | * | 11/1998 | Miller et al. ................. | 714/724 |
| 6,226,776 B1 | * | 5/2001 | Panchul et al. ................ | 716/3 |
| 6,351,142 B1 | * | 2/2002 | Abbott ......................... | 326/38 |

OTHER PUBLICATIONS

Li et al, "An Algorithm to Determine Mutually Exclusive Operations In Behavioral Descriptions," IEEE Proceedings of Design, Automation and Test in Europe, pp. 457–463 (Feb. 1998).*

Ravikumar et al, "A Graph–Theoretic Approach for Register File Based Synthesis," IEEE Proceedings of the 10$^{th}$ International Conference on VLSI Design, pp. 118–123 (Jan. 1997).*

Zobel, "Program Structure as Basis for Parallelizing Global Register Allocation," IEEE Proceedings of the 1992 International Conference on Computer Languages, pp. 262–271 (Apr. 1992).*

Chen, "Allocation of Multiport Memory With Ports of Different Type in Register Transfer Synthesis," 1991 IEEE International Conference on Computer Design: VLSI in Computers and Processors, pp. 418–421 (Oct. 1991).*

Rainer Leupers, Peter Marwedel, "Retargetable Generation of Code Selectors from HDL Processor Models," IEEE, 1997, pp. 140–144.

George Hadjiyiannis, Silvina Hanono, Srivinas Devadas, "ISDL: An Instruction Set Description Language for Retargetability," ACM, 1997, pp. 299–302.

Gyllenhaal et al., "HMDES Version 2.0 Specification," Helwett Packard Laboratories Technical Report IMPACT–96–3.

Hadjiyiannis et al., "A Methodology for Accurate Performance Evaluation in Architecture Exploration."

Hoogerbrugge et al., "Automatic Synthesis of Transport Triggered Processors."

(List continued on next page.)

*Primary Examiner*—Samuel Broda

(57) ABSTRACT

A method for the automatic design of processor datapaths operates on an abstract input specification of desired processor operations and their instruction level parallelism and synthesizes a datapath design in machine readable form. A datapath synthesizer automatically designs and synthesizes the processor datapath including the number and types of functional units, the number of read/write ports of the various register files, and the exact connectivity between the register files and the functional units. The heuristics used in the implementation maximize resource sharing and minimize the overall cost in by customizing and sharing functional units and minimizing the number of read/write ports on the register files subject to the specified ILP among operations.

5 Claims, 5 Drawing Sheets

OTHER PUBLICATIONS

Corporaal et al., "MOVE: A Framework for High-Performance Processor Design," ACM, 1991, pp. 692–701.
Corporaal et al., "Cosynthesis with the MOVE Framework."
Lanneer et al, "Chapter 5—Chess: Retargetable Code Generation for Embedded DSP Processors," Code Generation for Embedded Processors, Kluwer Academic Publications, pp. 85–102.
Fauth, "Chapter 8—Beyond Tool-Specific Machine Descriptions," Code Generation for Embedded Processors, Kluwer Academic Publications, pp. 138–152.
G. J. Chaitin, "Register Allocation & Spilling Via Graph Coloring," ACM, 1982, pp. 98–105.
Fisher et al., "Custom–Fit Processors: Letting Applications Define Architectures," $29^{th}$ Annual Conference IEEE/ACM International Symposium on Microarchitecture, Dec. 2–4, 1996, Paris, France, pp. 324–336.
Aditya et al., "Elcor's Machine Description System: Version 3.0" HPL–98–128, Oct. 1998, pp. 1–75.
Rau et al., "Machine–Description Driven Compilers for EPIC Processors," HP Laboratories Technical Report, HPL–98–40, Sep. 1998, pp. 1–82.
Kathail et al., "HPL PlayDoh Architecture Specification: Version 1.0," HP Laboratories Technical Report, HPL–93–80, Feb. 1994, pp. 1–48.

* cited by examiner

AUTOMATIC DESIGN OF PROCESSOR DATAPATHS

TECHNICAL FIELD

The invention relates to the design of processors in general, and in particular, the automated design of processor datapaths.

BACKGROUND

VLIW processors exploit instruction-level parallelism (ILP) by issuing several operations per instruction to multiple functional units. In order to make the scheduling of operations tractable, all operations are assumed to be register-to-register. This places a lot of stress on the design of the processor datapath, which often centers around the design of register files that need to distribute a dozen or so operands each cycle to multiple functional units and accept multiple operands for writeback at various times. The processor datapath is comprised of functional units, register files, and the interconnect for carrying data back and forth between the register files and functional units. The functional units are responsible for executing operations supported in the processor's instruction format, while the register files store the source and destination operands of these operations.

A good design of a processor's datapath uses one or more multi-ported register files and a careful optimization of their read/write ports and interconnect datapath to the various functional units in order to maximize resource sharing and minimize cost.

Today, this design is conducted manually by designing a register-transfer level (RTL) model where the number and kinds of the functional units, the register files, and the topology of the datapath interconnect are decided by hand. This is a fairly cumbersome and error-prone process requiring hours of simulation and verification to achieve the desired functionality and to avoid unnecessary structural hazards. Traditionally, a small set of such designs (often 1) is created manually on the basis of simple qualitative analysis or a gut-feeling based on past experiences of the architect. The process of optimizing the number of read/write ports of the register files and orchestrating their usage by the various functional units at various times is also a very challenging and difficult task to be performed manually.

SUMMARY OF THE INVENTION

The invention provides an automated method for the design of a processor datapath. The current implementation of the method is particularly directed to the automatic design of cost-efficient VLIW processor datapath topologies drawn from a pre-defined family of VLIW architectures. However, the method may be used to automate the design of other types of programmable processors, including single-issue microprocessors.

Based on a specification of the operations to be implemented in a machine and the amount of desired parallelism, the current implementation automatically designs and synthesizes the processor datapath including the number and types of functional units, the number of read/write ports of the various register files, and the connectivity between the register files and the functional units. The implementation employs heuristics to maximize hardware resource sharing and minimize the overall cost of the design. In particular, it shares functional units and minimizes the number of read/write ports on the register files subject to the specified ILP among operations.

The current implementation is most useful as a tool for automatic design of custom and general-purpose VLIW datapaths drawn from a family of VLIW architectures. It can also be used as a tool for a quantitative design space exploration of the various architectural parameters and topologies and evaluating the cost-performance tradeoffs among various designs. It enables a completely automatic design cycle where a design is specified, synthesized, evaluated and explored in an automatic way.

The automated method for designing processor datapaths is implemented in a number of program modules. These modules may be used individually or in a variety of combinations for unique design scenarios. In one scenario, the method programmatically computes a datapath specification from an abstract Instruction Set Architecture (ISA) specification and a macrocell library. The abstract ISA specification provides the processor's operations (e.g., an opcode repertoire), a register file specification, and instruction level parallelism constraints. The macrocell library includes components specified in a hardware description language, such as ALUs, register files, registers, gates and multiplexors. In computing the datapath, the method instantiates macrocells from the library and specifies how these macrocell instances are connected.

In another scenario, the method programmatically computes a specification of the processor's functional unit macrocells from the abstract ISA specification and macrocell library. This scenario is a subset of the first in that it provides the functional units in the datapath, but not the interconnect between the functional units and register files.

In yet another scenario, the method programmatically computes a register file to functional unit interconnect in a processor using information from the abstract ISA specification and the processor's functional units which are pre-selected from the macrocell library. This scenario involves a programmatic resource allocation of register file ports to functional unit ports. In determining this allocation, the design method uses the ILP constraints to determine opportunities for sharing register file ports for two or more functional unit ports.

Additional features and advantages will become apparent in the following detailed description and accompanying drawings.

DETAILED DESCRIPTION

Introduction

Figure 1:
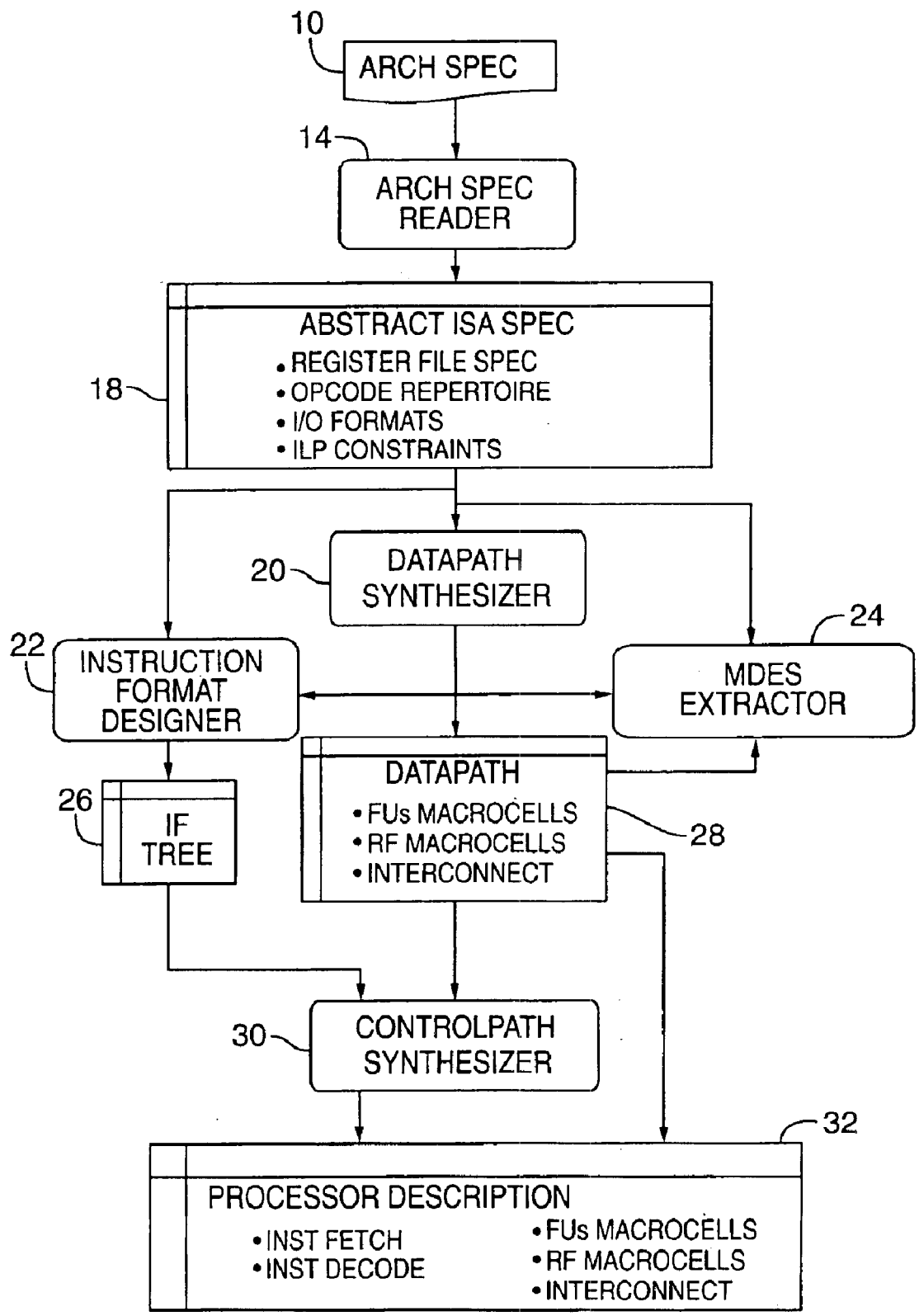
FIG. 1 illustrates an implementation of an automated processor design system.

FIG. 1 illustrates an implementation of an automated processor design system. While this particular system is designed for the synthesis of a VLIW processor, it also illustrates how a similar design system might be implemented for a single-issue processor. At a high level, the system takes as input a high level processor specification (e.g., ArchSpec 10) and automatically produces a complete hardware description of the processor design 32. The system is implemented in a series of program modules, generally organized as shown in the diagram.

The system illustrated in FIG. 1 is implemented in the C++ programming language. While the system may be ported to a variety of computer architectures, the current implementation executes on a PA-RISC workstation or server running under the HP-UX 10.20 operating system. The system and its components and functions are sometimes referred to as being "programmatic." The term "programmatic" refers to a process that is performed by a program implemented in software executed on a computer, in hard-wired circuits, or a combination of software and hardware. In the current implementation, the programs as well as the input and output data structures are implemented in software stored on the workstation's memory system. The programs and data structures may be implemented using standard programming languages, and ported to a variety of computer systems having differing processor and memory architectures. In general, these memory architectures are referred to as computer readable media.

The high level input specification comprises a desired set of machine operations together with an abstract specification of the concurrency and resource sharing constraints among them. A concurrency constraint identifies which operations are allowed to be issued at the same time, while a resource sharing constraint identifies which operations cannot be issued at the same time. To generalize these concepts, we refer to them as instruction-level parallelism (ILP) constraints. The ILP constraints may be specified (1) directly as sets of concurrent operations, (2) as sets of mutually exclusive operations, or (3) as some combination of exclusions and concurrency sets. The ILP constraints specify the amount of ILP within the processor directly in terms of which operations are allowed to execute in parallel and which ones may share a processor resource.

There are two principal methods for specifying the input. In a typical application, the user specifies the input, at least initially. In some applications, a design space exploration program may provide or modify the input specification based on pre-determined design criteria. These approaches are not clearly distinct because there a number of applications where the input is initially user-specified, and then refined in an automated process. For example, in a first design pass, the user may provide the initial input specification (in a textual form), and an automated design space exploration program may make subsequent refinements by modifying the operations or ILP constraints in the original input specification. The system may also provide the input specification based on some high level design criteria from the user, such as a pre-defined processor type, and then the user may refine the input specification after one or more design cycles that generate the hardware design. In both cases, the operations and register file types are typically selected from a superset of pre-defined operations and register file types.

To help clarify the nature of the input specification, we begin with definitions of the constructs used to define the input in the current implementation.

Operation Set

An operation set is a set of opcodes that are mutually exclusive. The ability to represent opcodes in an operation set is only a convenience and is not required to implement the system. While each operation set can consist of a single opcode, it is more convenient to specify opcodes with similar properties as a set. This approach simplifies the input specification because the user (or another program module) need only specify desired concurrency and/or exclusion relationships among sets of operations, as opposed to each individual operation. Though not required, the opcodes in an operation set may share similar properties, such as latency and data type. For example, integer arithmetic operations such as ADD and SUBTRACT might be organized in an operation set. In the description that follows, we use the notation, ops ( ) to represent an operation set in textual form.

Operation Group

An operation group is an instance of an operation set. Operation groups make it possible to specify that multiple instances of the same operation be issued concurrently. For example, one may want a processor to be able to execute three integer ADD operations concurrently. Thus, the designer could specify that the input specification will include three operation groups, A, B, C, each representing an instance of the operation set, ops (ADD SUB).

Operation Group Occurrence

An operation group occurrence is an occurrence of an operation group in a particular concurrency set or exclusion set. The operation group occurrence enables the processor designer to identify concurrency or exclusion relationships among operation groups explicitly in the input specification. For example, consider an operation group A that is an instance of the operation set ops (ADD SUB). This operation group may be issued concurrently with many different combinations of other operation groups. In order to specify these concurrency relationships, the input specification allows a different "occurrence" (e.g., $A_1$, $A_2$, etc.) of the same operation group to be member of each of these concurrency sets.

Concurrency Set

A concurrency set is a set of operation group occurrences that may be issued concurrently.

Exclusion Set

An exclusion set is a set of operation group occurrences that are mutually disjoint. In other words, the exclusion set specifies a set of operation groups, each having operations that cannot be executed concurrently with any of the operations in each of the other groups in the exclusion set. When specifying ILP constraints in terms of an exclusion set, the exclusion sets may be expressed as a set of operation groups or operation group occurrences.

Abstract Instruction Set Architecture Specification

An Abstract Instruction Set Architecture (ISA) Specification is an abstract specification of a processor design and may include the following:

- an opcode repertoire, possibly structured as operation sets;
- a specification of the I/O format for each opcode;
- a register file specification, including register files and specifying their types and the number of registers in each file;
- a specification of the desired ILP constraints, making use of some form of concurrency sets, exclusion sets or a combination of concurrency and exclusion sets, that specifies which sets of operation groups/opcodes can be issued concurrently; and other architecture parameters, e.g., presence/absence of predication, speculation, etc.

There are a variety of ways to represent the ILP constraints. The user (or another program module) may specify the desired ILP by specifying exclusion and concurrency relationships among operation group occurrences. One way to specify exclusion and concurrency relationships is to construct a data structure representing AND-OR relationships among operation group instances, such as a multi-level AND-OR tree. In such a structure, an AND relationship represents a concurrency relationship among operation group occurrences. Conversely, an OR relationship represents an exclusion relationship among operation group occurrences. Another way to specify exclusion and concurrency relationships is through a graph data structure where the nodes represent operation group occurrences, for example, and the edges connecting the nodes represent exclusion or concurrency relationships among the nodes. Yet another way is to specify pairwise exclusions between operation group occurrences.

ArchSpec

The ArchSpec is a textual, external file format for the Abstract ISA specification. As illustrated in FIG. 1, the ArchSpec may be converted to an abstract ISA spec data structure, which is then processed further to synthesize a processor design. While the specific format of the ArchSpec is a textual file, it is not critical that the input be specified in this form. For example, the input could be specified via a graphical user interface and converted into an abstract ISA data structure.

Overview of an Automated Processor Design System

Referring to FIG. 1, the ArchSpec 10 in the current implementation includes an opcode repertoire, I/O formats, ILP constraints and register file specification. The system uses this information to allocate functional units and interconnect them with the register files in the datapath design.

In the implementation shown in FIG. 1, the ArchSpec is written in a high-level database language. An ArchSpec reader 14 parses the ArchSpec 10 to build an internal abstract ISA spec data structure 18. At this stage in the design process, the abstract ISA spec data structure 18 contains a machine-readable set of tabular parameters and constraints, including register file entries, operation groups, and exclusion/concurrency relationships.

The datapath synthesizer 20 processes the abstract ISA spec 18 to generate the datapath design 28. During the datapath synthesis process, the datapath synthesizer allocates instances of various functional units (FUs) and register files from a macrocell database library or libraries, along with interconnect circuitry to interface the register files with the allocated FUs. The macrocell database provides a list of synthesized, re-usable components such adders, multipliers, registers, Fast Fourier Transform (FFT) blocks, along with a pointer to a VHDL or Verilog description.

The datapath design output 28 is a machine-readable specification that includes the FU macrocell instances, register file macrocell instances, and an interconnect network connecting the functional units and the register files. It is stored in an Architecture Intermediate Representation (AIR) 32 as a set of related classes in a netlist form, enumerating the macrocell instances and their interconnect components, such as multiplexors, tri-state buffers, buses, etc. AIR is a hardware description language, which is similar to VHDL, but is implemented in a computer language (C++) that makes hardware components described in AIR format easier to manipulate with the program routines.

The system has another program module that can generate a VHDL or Verilog design description from the AIR representation. This program module converts macrocell instances in AIR format to VHDL or Verilog format using the parameters in the AIR representation to instantiate the VHDL or Verilog macrocells.

The MDES extractor 24 generates a machine description (MDES) that may be used to re-target a compiler to a specific machine. In particular, the current implementation employs an MDES-driven compiler that can be re-targeted to a specific machine being designed based on the MDES constructed by the composite MDES extractor 24. The compiler input includes an MDES representation of the opcode repertoire and the resources that are used for each operation. Using this input, the compiler is re-targeted for the machine. It can then be used to schedule an application program and generate statistics about the use of the opcodes that are useful in customizing the machine's design. This is particularly useful in the design of application specific processors that are designed for a particular type of application program. For more information about the MDES extractor, please see co-pending U.S. patent application Ser. No. 09/378,601, filed Aug. 20, 1999, now U.S. Pat. No. 6,629,312, by Shail Aditya Gupta entitled PROGRAMMATIC SYNTHESIS OF A MACHINE DESCRIPTION FOR RETARGETING A COMPILER, which is hereby incorporated by reference.

The instruction format designer 22 generates instruction formats based on the datapath design and the abstract ISA spec. In particular, it builds a syntax tree called the instruction format (IF) graph 26, and then uses the tree to allocate bits in the processor's instruction unit to the fields of VLIW instructions. For more information about this process, please see co-pending U.S. patent application Ser. No. 09/378,293, filed Aug. 20, 1999, now U.S. Pat. No. 6,457,173, by Shail Aditya Gupta, Bandtwal Ramakrishna Rau, Vinod Kumar Kathail, Richard Craig Johnson and Michael S. Schlansker, entitled AUTOMATIC DESIGN OF VLIW INSTRUCTION FORMATS, which is hereby incorporated by reference.

The controlpath synthesizer 30 processes the IF graph 26 and the datapath design 28 to generate the controlpath design. The controlpath design is a machine-readable specification describing the instruction fetch and decode units in the processor design, including the control signals for the functional units and register files, and the organization of the instruction processing pipeline. To complete the VLIW synthesis process, the controlpath design fills in the control components and signals to the datapath design already in the AIR 32 representation of the processor. For more information on the control path design process, please see co-pending patent application Ser. No. 09/378,394, filed Aug. 20, 1999, now U.S. Pat. No. 6,490,716 by Shail Aditya Gupta and Bantwal Rainakrishna Rau, entitled, AUTOMATED DESIGN OF PROCESSOR INSTRUCTION UNITS, which is hereby incorporated by reference.

ArchSpec

The ArchSpec 10 is an abstract textual description of a specific VLIW machine drawn from a generic architecture family, such as the HPL-PD family of architectures. (See Vinod Kathail, Michael Schlansker, B. Ramakrishna Rau. HPL PlayDoh Architecture Specification: Version 1.0. Technical Report HPL-93-80. Hewlett-Packard Laboratories, February, 1994.) In the context of this document, the term VLIW is construed broadly to encompass Explicitly Parallel Instruction computing architectures. The architecture family specifies a superset of opcodes (e.g., the HPL-PD family instruction set), a set of logical register files to store various types of operands, and a specification of which logical files each opcode can source/sink its operands from/to—its (logical) operation format. The specification further specifies the semantics of important architectural mechanisms that may be included or excluded, such as predication, speculation, support for modulo-scheduling etc.

At an abstract level, the ArchSpec need only specify the functionality of the hardware implementation in terms of its opcode repertoire and the desired performance level. In general, the ArchSpec enumerates the set of opcode instances that are to be implemented by the target machine, and provides a description of the amount of ILP that is to exist among them.

For convenience, the various instances of the opcodes for a given machine are grouped into Operation Groups, each of which is a set of opcode instances that are similar in nature in terms of their latency and connectivity to physical register files and are to be mutually exclusive with respect to operation issue. For example, since add and subtract operations require similar operand types and execute on the same ALU, their respective opcode instances may be placed in the same operation group. By definition, all opcode instances within an operation group are mutually exclusive, while those across operation groups are allowed to execute in parallel.

The parallelism of the machine may be further constrained by placing two or more operation groups into a form of an exclusion set called an Exclusion Group, which makes all their opcode instances mutually exclusive and allows them to share resources. For instance, an exclusion group may include multiply and add operations that reside on separate functional units yet share the same result bus.

As an example, a simple 2-issue machine is specified below. This example specification is expressed in a database language called HMDES Version 2. See John C. Gyllenhaal, Wen-mei W. Hwu, and B. Ramakrishna Rau. HMDES version 2.0 specification. Technical Report IMPACT-96-3, University of Illinois at Urbana-Champaign, 1996. This language organizes the information into a set of interrelated tables called sections containing rows of records called entries. Each entry contains zero or more columns of property values called fields.

```
SECTION Operation Group {
    OG_alu_0 (ops (ADD SUB) format (OF_intarith2));
    OG_alu_1 (ops (ADD SUB) format (OF_intarith2));
    OG_move_0 (ops (MOVE) format (OF_intarith1));
    OG_move_1 (ops (MOVE) format(OF-intarith1));
    OG_mult_0 (ops (Mpy) format (OF_intarith2));
    OG_shift_1 (ops (SHL SHR) format (OF-intarith1));
}
```

```
SECTION Exclusion_Group {
EG_0 (opgroups (OG_alu_0 OG_move_0 OG_mult_0));
EG-1 (opgroups (OG_alu_1 OG_move_1 OG_shift_1));
}
```

This example specifies two ALU operation groups (OG_alu_0, OG_alu1), two move operation groups (OG_move_0, OG_move_1), one multiply group (OG_mult_0), and one shift group (OG_shift_1). These operation groups are further classified into two exclusion groups (EG_0, EG_1) consistent with a two-issue machine. The multiply group shares resources with one ALU group, while the shift group shares resources with the other. Each operation group also specifies one or more operation formats shared by all the opeodes within the group. Additional operation properties such as latency and resource usage may also be specified, as shown below.

```
SECTION Operation_Group (
    OG_alu 0      (ops (ADD SUB) format("OF-intarith2")
                   latency (OL_int
                   resv (RT_OG_alu_1)
                   alt_priority (O));
}
```

The "resv" parameter provides an abstraction for specifying user-defined sharing. The "alt_priority" parameter provides the priority of the operation group in the MDES, which the retargetable compiler uses to schedule the operations. There is a similar set of parameters for each operation group.

The ArchSpec additionally includes information to describe the physical register files of the machine and the desired connectivity of the operations to those files. A Register File entry defines a physical register file of the machine and identifies its width in bits, the registers it contains, and a virtual file specifier corresponding to the type of data (operands) it is used to carry. The virtual specifier assumes an implied connectivity between the opcodes and the register file, e.g., a floating point opcode would need to connect to a floating point-type register file, etc. As an alternative to implied connectivity, the user may specify an explicit connectivity by specifying a mapping between each operation and the type of register file associated with it.

The register file entry may also specify additional properties such as whether or not the file supports speculative execution, whether or not the file supports rotating registers, and if so, how many rotating registers it contains, and so on. The immediate literal field within the instruction format of an operation is also considered to be a (pseudo) register file consisting of a number of "literal registers" that have a fixed value.

The Operation Format entries specify the set of choices for source/sink locations for the various operations in an operation group. Each operation format consists of a list of Field Types that determine the set of physical register file choices for a particular operand. For predicated operations, the input specification may also specify a separate predicate input field type containing a predicate register file.

The code listing below provides an example of the register file and operation format inputs sections of an ArchSpec:

```
SECTION Register_File (
    gpr(width(32) regs (r0 r1 . . . r31) virtual(I));
    pr(width(1) regs (p0 p1 . . . p15) virtual(P));
    lit(width(16) intrange (--32768 32767) virtual(L));
    SECTION Field_Type
        FT_I(regfile(gpr));
        FT_P)regfile(pr));
        FT_L(regfile(lit));
        FT_IL(compatible-with(FT-I FT-L));
}

SECTION Operation_Format
    OF    intarith1 (pred (FT P) src (FT_I) dest (FT 1));
    OF    intarith2 (pred (FT-P) src (FT_IL FT_I) dest FT-I));
}
```

The example shows that the above machine has a 32-bit general purpose register file "gpr", a 1-bit predicate register file "pr" and a 16-bit literal (pseudo) register file "lit". Each register file can be used alone or in conjunction with other files in a field type specification as a source or sink of an operand. The field types for the predicate, source and destination operands are combined to form the valid operation formats for each operation group. For example, the 2-input ALU operation group "OG_aluO" (See "SECTION Operation_Group" above) has an operation format "OF_intarith2", which specifies that its predicate comes from the predicate register file spry, its left input is an integer from either a literal register file or from a general purpose register file "gpr", its right input is from "gpr" and its output is written to the general purpose register file "gpr".

The specification may also contain information defining additional architecture parameters:

```
SECTION Architecture_Flag {
  predication_hw (intvalue (1));
  speculation_hw (intvalue (0));
  systolic_hw   (intvalue (1));
  technology scale (doublevalue (0.35));
}
```

This section lists processor parameters indicating whether the processor architecture supports predication, speculation, and a systolic coprocessor. The last parameter is a technology scale, specifying a desired manufacturing level (e.g., 0.35 micron). The technology scale can be used to calculate the area of silicon required to manufacture the processor. For instance, when the silicon area is a design constraint on datapath synthesis, the synthesis process uses this information to evaluate the cost (e.g., chip area) of a particular design. The synthesis process may select functional units, for example, that satisfy a constraint on the silicon area.

Abstract ISA Specification

The system converts the ArchSpec into an internal form that is easier to manipulate and traverse programmatically. The program module called the reader 14 reads the ArchSpec and generates the internal form of the abstract ISA specification.

In the implementation, the internal form of the abstract ISA specification provides a normalized representation of the ArchSpec in terms of ILP constraints. In particular, both exclusion and concurrency sets are expressed in terms of opgroup occurrences. To generate this normalized representation, the reader extends the ILP constraints as follows. For each opgroup occurrence in a concurrency group (if any), the reader gives the opgroup occurrence a unique name. The reader then collects all opgroups occurrences of one opgroup into a new exclusion group. Next, it expands each opgroup in an exclusion group by its set of all opgroup occurrences.

The reader also carries over all other properties from the ArchSpec including register files, field types, operation formats, and architecture flags. In the abstract ISA specification, each opgroup occurrence behaves like an opgroup. Therefore, the terms "opgroup" and 'opgroup occurrence' may be treated synonymously in the subsequent discussion.

Figure 2:
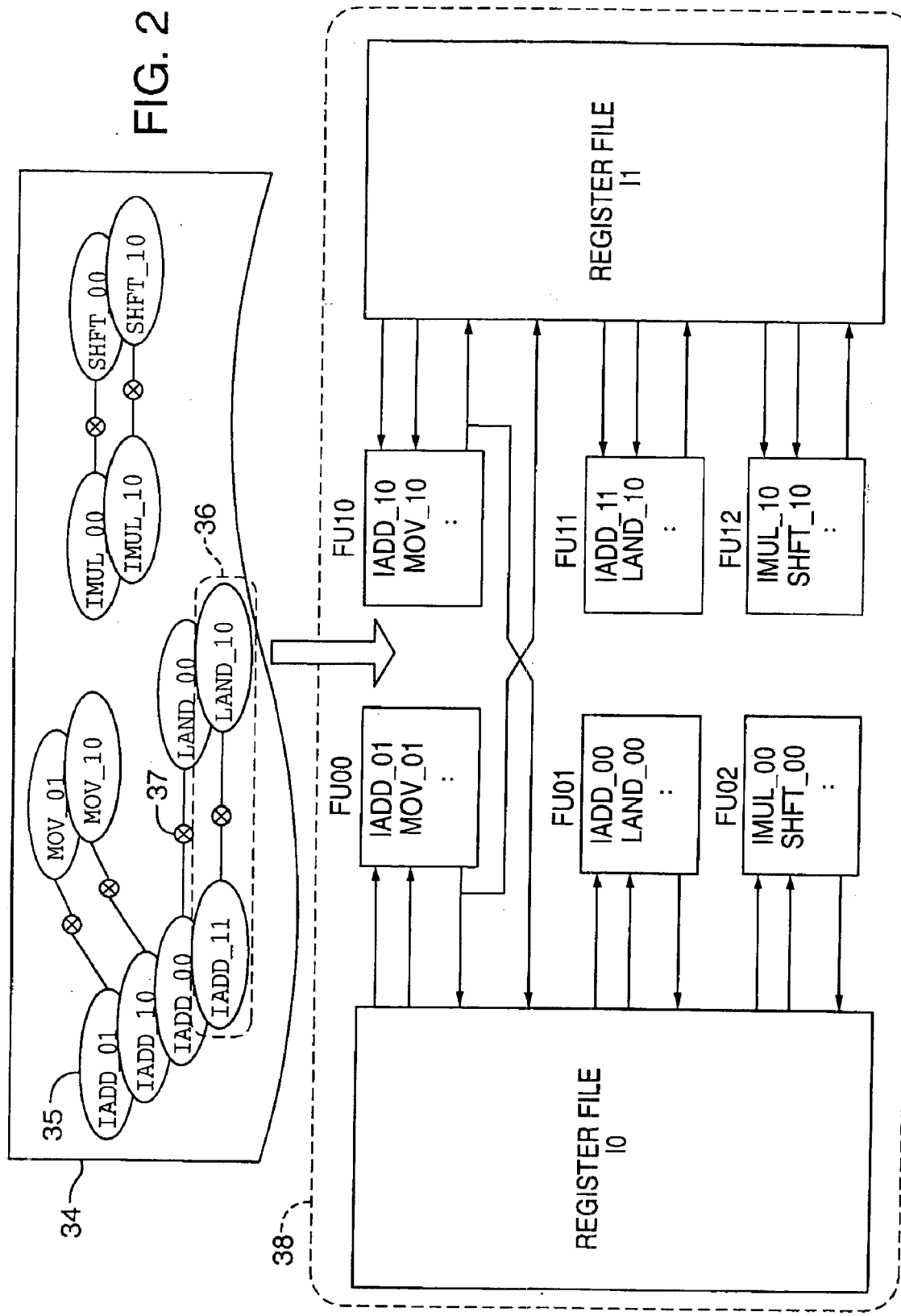
FIG. 2 shows an example of how the system might assign functional units and allocate register file ports based-on a high level specification of operation groups and resource sharing constraints among these groups.

To illustrate the relationship between the abstract input and the corresponding datapath output, FIG. 2 graphically depicts an example of an input specification 34 and a corresponding datapath design 38. The datapath synthesizer 20 (FIG. 1) processes an input specification like the one graphically depicted in FIG. 2 (e.g., Item 34) to create a physical datapath representation 38, which is shown as a set of functional units (FU00–FU12), register files (I0–I1), and the interconnect topology between them. As shown in this example, the input specification 34 provides the desired operation groups 35, and specifies the instruction level parallelism among these groups as "exclusion groups" (e.g., IADD_11 and LAND_10 are related as an exclusion group 36). Each operation group includes one or more opcode instances; for simplicity, only a single opcode instance is shown for each operation group. Each operation group typically contains opcodes that have similar resource requirements and latency. Each exclusion group 36 comprises two or more operation groups (only two are shown here) whose opcode instances are mutually exclusive, as illustrated by exclusion marker 37 connecting the op groups together. For instance, the opcode-instances in operation group IADD_11 are mutually exclusive with the opcode instances in operation group LAND_10. When operation groups are marked as mutually exclusive, the datapath synthesizer may force them to share processor resources by, for example, assigning them to the same functional unit. When these opgroups share a hardware resource, the compiler will not schedule them to issue concurrently. If operation group occurrences are marked as being concurrent (e.g., in a concurrency set), the datapath synthesizer will synthesize the datapath so that these operations may be issued concurrently. When the opgroup occurrences are specified as part of a concurrency set, the compiler may schedule the corresponding operations to issue concurrently.

The datapath synthesizer 20 (FIG. 1) converts the abstract input specification into a machine-readable datapath representation. The datapath representation is a set of related classes that define instances of functional units, register files, etc., and their interconnect, in the form of data buses, muxes, etc. The datapath representation may then be processed to produce a hardware description of the datapath in a hardware description language, e.g., a structural VHDL or Verilog description, which can be further processed to produce a physical datapath; such as that shown in FIG. 2.

A principal objective of datapath synthesis is to maximize processor functionality and throughput without requiring excess duplication of opcode instances and/or functional unit instances. Since operation groups with no exclusion relationship can be issued concurrently, the opcode instances within these operation groups must be placed on separate functional units. Conversely, the opcode instances of operation groups that are marked as mutually exclusive may be placed on the same functional unit. With these design guidelines, the datapath synthesizer attempts to assign a single functional unit to operation groups that are exclusive, and places concurrent operations on different functional units, as shown in the physical datapath representation 38.

The physical datapath 38 in FIG. 2 includes six functional units, FU00, FU01, FU02, FU10, FU11, and FU12, and two register files, I0 and I1. The synthesis process selects each functional unit to meet the requirements of the opcode instances, such as IADD, MOV, SHFT, etc. Next, the process allocates the register ports of register files I0 and I1 to satisfy the port requests of the opcode instances. Finally, the process creates the interconnect based on the port allocation. The lines leading into the register files are write lines, while the lines leading out of the register files are read lines. In an actual design, the number and type of functional units, I/O lines, register files, etc., will depend on the architecture specification for a particular target machine.

The process of assigning functional units to opcode instances directly follows the constraints specified in the abstract input 34. For example, the opcode instances of the IADD, MOV, LAND, IMUL, and SHFT operation groups, which are not mutually exclusive, are placed on separate functional units. The pairwise exclusion relationships between the IMUL and SHFT operation groups causes the synthesizer to place IMUL_00 and SHFT_00 on the same functional unit, if possible. In general, the datapath representation 38 shows that the opcode instances of mutually exclusive pairs of operation groups from the input specification 34 share functional units.

The remaining components of the datapath 38, namely the register files and their interconnect to the functional units, are synthesized on the basis of the register file and operation format specification present in the abstract ISA specification. For example, the operation format for IADD-01 and MOV-01 operation groups must specify that their inputs are drawn from register file I0 and its output is deposited in register file I1. Similarly, the operation format for IADD-10 and MOV-10 operation groups must specify that their inputs are drawn from I1 and outputs go to either I0 or I1. This gives rise to the cross-connected function units FU-00 and FU-10.

An example of the textual description of these register file an d operation format specifications is provided below.

```
SECTION Field Type {
    FT_I0 (regfile (I0));
    FT_I1 (regfile(I1));
}
SECTION Register File {
    I0(width (32) regs (I0r₁ ... I0r₃₁) virtual (I));
    I1(width (32) regs (I1r₁ ... I1r₃₁) virtual (I));
}
SECTION operation_Format {
    OF_intarith2_I0_I0 (pred( )src(FT_I0 FT_I0)
        dest (FT_I0));
    OF_intarith2_I0_I0 (pred( ) src(FT_I0 FT_I0)
        dest(FT_I0 FT_I1));
}
```

Datapath Synthesis

Figure 3:
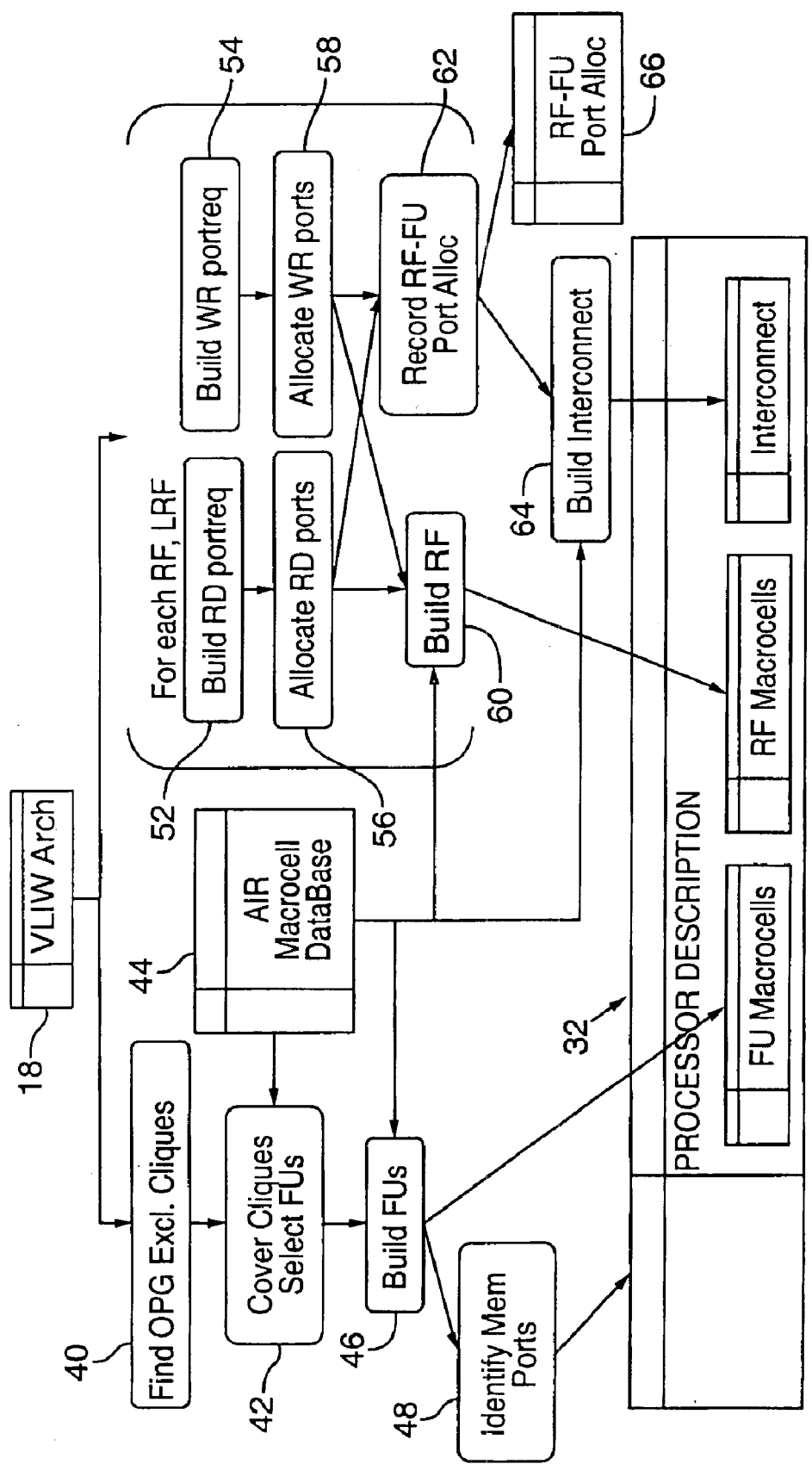
FIG. 3 is a flow diagram illustrating an implementation of the datapath synthesis process shown in FIG. 1.

FIG. 3 is a flowchart of an implementation of the datapath synthesis process shown in FIG. 1. The abstract ISA spec 18 is a machine-readable data structure that specifies register files, operation groups, ILP constraints, and architecture parameters. The datapath synthesis includes two primary phases: 1) synthesis of the functional unit instances (see steps 40, 42, 44, 46, and 48) and 2) register file and interconnect synthesis (see steps 52, 54, 56, 58, 60, 62, 64, and 66).

Functional Unit Synthesis

In the synthesis of the functional units, the first step is to determine the maximal sets of mutually-exclusive operations based on the ILP constraints. In the current implementation, the datapath synthesizer finds these sets of exclusive operations by setting up a graph of the exclusion relations among operation groups and then finding cliques in the graph. A clique is a well-known computer science term for a maximal set of nodes in a graph, where each node in the set connects with every other node in that set. In the context of an exclusion graph, the cliques represent a maximal set of operation group nodes where the operation groups are exclusive with every other operation group in the set. The connections among the nodes in the graph represent exclusion relationships between the operation groups.

Figure 4:
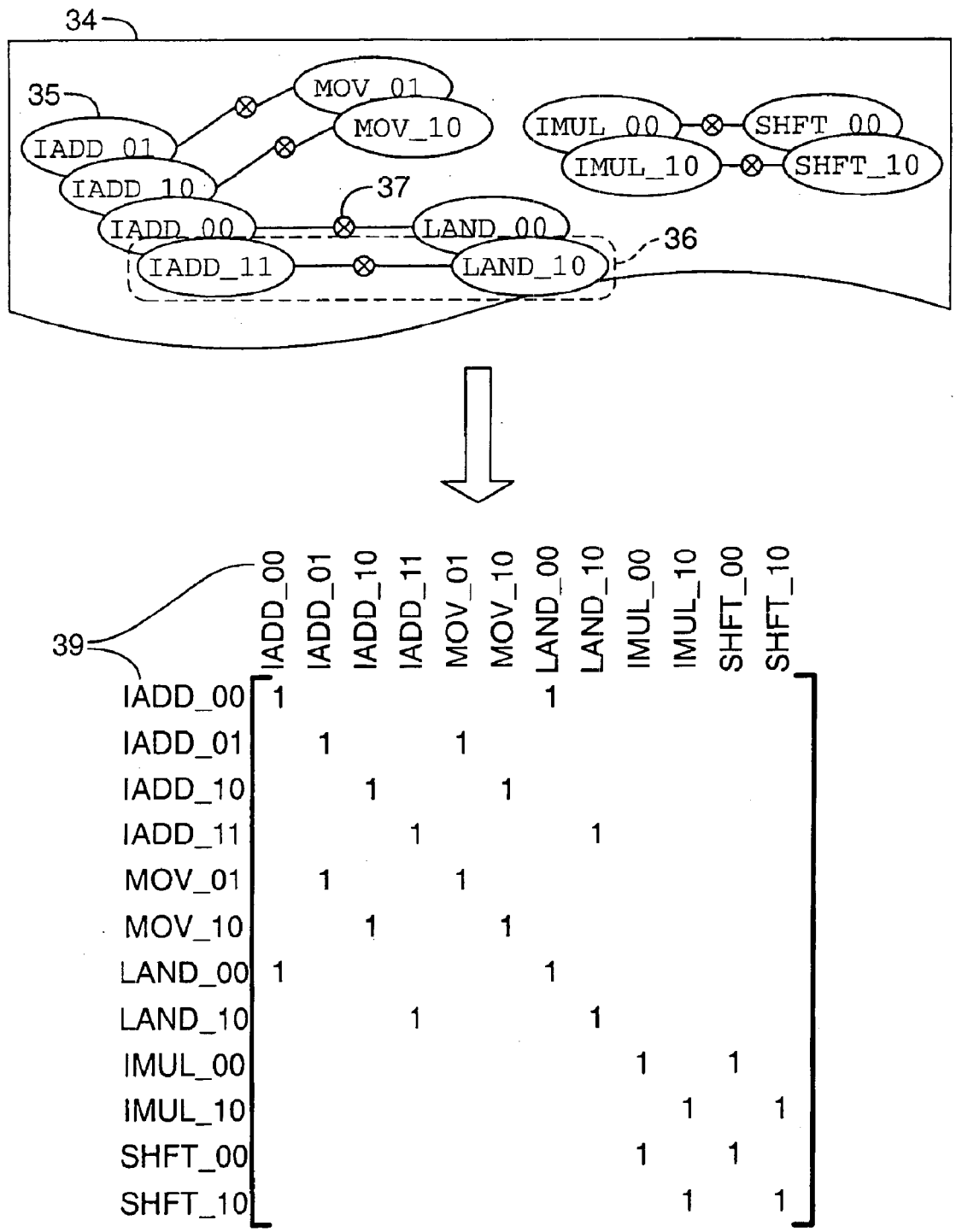
FIG. 4 is an example of a data structure used to represent resource sharing constraints in the datapath synthesis process.

Exclusion cliques represent sets of operation groups that cannot be executed concurrently. In the current implementation, the process of finding cliques begins by generating a Boolean exclusion matrix that identifies the exclusion relationships between operation groups based on the ILP constraints. FIG. 4 illustrates an example of an exclusion matrix corresponding to the abstract specification 34 from FIG. 2. The exclusion matrix for a given set of N operation groups will comprise an N×N matrix, where the rows and columns are both labeled with the same operation group identifier 39. Operation groups that are mutually exclusive are then marked with a "1", while all other values are "0" (not shown here for clarity). By default, all of the values along the diagonal of the matrix are set to 1 s, since an operation group is assumed to be mutually exclusive with itself. The exclusion matrix values will always mirror about the diagonal, so that only one half of the matrix is actually needed for processing.

It is possible to reduce the size of the problem by collapsing nodes that are equivalent in terms of exclusion/concurrency relations.

After building the exclusion matrix, the datapath synthesizer executes a recursive algorithm on the matrix data to find the exclusion cliques. The exclusion graph naturally follows from the exclusion relationship expressed in the matrix. The recursive algorithm operates on this graph according to the following pseudocode:

```
 1: // Check if any candidate remains
 2: if (candidatenodes is empty) then
 3: // (check it the current set of clique nodes is maximal
 4: if (currentclique is maximal) then
 5: Record(currentClique);
 6: endif
 7: else
 8: StartNodes = Copy(candidateNodes);
 9: while (StartNodes is not empty) do
10: H1: if (currentclique ∪ candidatenodes ⊆ some
        previous Clique) break
11: node = pop (StartNodes);
12: candidatenodes = candidatenodes - [nodes];
13: if (currentclique ∪ (node) is not complete) continue;
14: H2: pruneNodes = candidateNodes ∩ NeighborsOf(node);
15: RecursiveFindCliques (currentClique ∪ {node}, prunednodes);
16: H3: if(candidatenodes) ⊆ NeighborsOf(node) break;
17: H4: if(this is first iteration) startNodes = startNodes-
        neighborsOf(node);
16: endwhile
17: endif
```

The algorithm recursively finds all cliques of the graph starting from an initially empty current clique by adding one node at a time to it. The nodes are drawn from a pool of candidate nodes which initially contains all nodes of the graph. The terminating condition of the recursion (line 2) checks to see if the candidate set is empty. If so, the current set of clique nodes is recorded if it is maximal (line 4), i.e. there is no other node in the graph that can be added to the set while still remaining complete.

If the candidate set is not empty, then the algorithm proceeds to grow the current clique with the various candidates as potential starting points. An exponential search is performed at this point. Various heuristics have been published for growing the maximal cliques quickly and to avoid examining sub-maximal and previously examined cliques repeatedly. (See Ellis Horowitz and Sartaj Sahni, "Fundamentals of Computer Algorithms," Computer Science Press, Rockville, Md., 1984.) The first heuristic (H1) checks to see whether the current clique and the candidate set is a subset of some previously generated clique. If so, the current procedure call cannot produce any new cliques and is pruned. Otherwise, the algorithm continues to grow the current clique with the candidates one by one.

Each candidate node is processed for inclusion into the current clique as follows. If the selected candidate forms a complete graph with the current clique (line 13), the algorithm adds it to the current clique and calls the procedure recursively with the remaining candidates (line 15). The second heuristic (H2) is to restrict the set of remaining candidates in the recursive call to just the neighbors of the current node since any other node will always fail the completeness test within the recursive call. After the recursive call returns, if the remaining candidate nodes are found to be all neighbors of the current node, then the algorithm can also prune the remaining iterations within the current call (H3) since any clique involving any of those neighbors must include the current node and all such cliques were already considered in the recursive call. Finally, if non-neighboring candidates are present, we can still drop the neighbors of the current node as starting points for the first iteration only (H4).

While we have illustrated a specific example of finding cliques in a graph, there are other algorithms for accomplishing this task. In addition, there are alternative approaches for finding sets of mutually exclusive operations that do not involve cliques. It is also possible to identify sets of concurrent operation group occurrences, and then assign FUs so that the operation group occurrences in each set are assigned to different FUs.

After finding maximal sets of mutually exclusive operation groups, the datapath synthesizer selects functional units from a standard or user specified macrocell library so that all of the opcodes occurring in each set are covered, i.e., able to be executed on the selected functional units. As shown in FIG. 3, the current implementation selects functional units to cover the exclusion cliques (see step 42). Next, the datapath synthesizer instantiates the selected functional units as shown (step 46). In building the functional units in this manner, the objective is to optimize the selection of functional unit instances so that all of the required opcodes are still supported while maintaining the exclusion requirements defined by the cliques. In some cases, it may not be possible to map individual cliques to a single functional unit, thereby necessitating the use of multiple functional units to support the opcode requirements of the clique. Pseudocode for covering the cliques and building the functional units is listed below:

```
BuildFUs (VLIWArch, listOfCliques)

1: foreach (OPG ∈ VLIWArch)
 2: build valid ListOfFUs(Opset(OPG)) from Database;
 3: // match opcodes, latency
 4: foreach (OPG ∈ VLIWArch)
 5: foreach (usedFU ∈ ListOfFUs(Opset(OPG)))
 6:   ListOfOpsets(useFU) += Opset(OPG);
 7: while (listOfCliques is not empty)
 8: find (bestFU ∈ usedFUs) such that
 9: forsome (clique ∈ listOfCliques)
10:   maxCoveredOPGs = {OPG | OPG ∈ clique,
11:   Opset (OPG) ∈ ListOfOpsets (bestFU) }
12:   H1: size (maxCoveredOPGs) is maximum
13:   H2: area (bestFU) is minimum
14:   instantiate (bestFU); record(maxCoveredOPGs);
15: foreach (clique ∈ listOfCliques)
16:   clique = maxCoveredOPGs;
```

The first task is to build a valid list of functional units from the macrocell database that will support the opcode and latency requirements of each of the operation groups of the VLIW architecture specification (line 1-2). And conversely, for each function unit, we identify the list of operations that it can possibly cover (line 4-6). For example, if the database contains an ALU0 functional unit that can perform ADD, SUBTRACT, and MOVE opcodes, and an ALU1 functional unit that can perform ADD and MOVE opcodes, then ListOfOpsets(ALU0)={ADD, SUBTRACT, MOVE};

ListOfOpsets(ALU1)={ADD, MOVE};

ListOfFUs(ADD)={ALU0, ALU1};

ListOfFUs(SUBTRACT)={ALU0};

ListOfFUs(MOVE)={ALU0, ALU1}.

At each iteration of the while loop starting at line 7, a FU is selected that best covers the operation groups of a remaining clique. The criteria for selection in this implementation use two heuristics. First, heuristic H1 favors FUs that cover the maximum number of remaining operation groups out of any remaining clique. The second heuristic H2 selects the FU that is of minimum area. Other heuristics may be used to optimize timing, power consumption, routability, geometry (for hard macros), etc.

The rest of the algorithm selects a set of FUs to be instantiated in the datapath, one by one, by looking at the requirements of the operation group cliques provided. Once the FU has been selected, it is instantiated in the datapath and the operations that it covers are recorded. Finally, the covered operation groups are eliminated from each of the remaining cliques and the cycle repeats until all cliques are covered and eliminated.

The next step 48 identifies which FUs out of the selected set require a memory port by checking their properties stored in the macrocell database. This step is necessary in order to identify the number of ports required to connect to the memory hierarchy. The memory hierarchy refers to the processor's memory design. The memory hierarchy may include, for example, a level 1 (L1) data cache, a level 2 (L2) data cache and global memory.

Register File and Interconnect Synthesis

Referring again to FIG. 3, the right side of this diagram illustrates the process of synthesizing the register files and inter-connect topology. Using the architecture specification as input, this process allocates register file ports and builds the interconnect to the functional units. As shown in steps 52 and 54, the datapath synthesizer builds a set of read/write port connection requirements for connecting the functional units to the register files for each type of register file in the VLIW specification, including literal register files (LRFs). The datapath synthesizer extracts these requirements from the format specification of source/sink operands of various operations mapped to the corresponding functional units.

Many of these register file port connections may be shared based upon the mutual exclusion specification of the corresponding operation groups. As an example, assume that we want to build read/write port requirements for a machine specified by the following description:

```
SECTION Operation_Group {
  OG_alu_0 (ops (ADD SUB) format(OF_intarith2));
  OG_alu_1 (ops (ADD SUB) format(OF_intarith2));
  OG_move_0 (ops (MOVE) format (OF-intarith1));
  OG_move_1 (ops (MOVE) format (OF-intarith1));
}
SECTION Exclusion Group {
  EG_0 (opgroups (OG_alu_0 OG_move_0)
  EG_1 (opgroups (OG_alu_1 OG_move_1)
}
SECTION Register_File {
  gpr (width(32) regs (r0 r1 . . . r31) virtual (I));
```

```
  pr (width(1) regs (p0 p1 . . . p15) virtual (P));
  lit (width(16) intrange (-32768 32767) virtual(L));
}
```

```
    SECTION Field_Type
    FT_I (regfile(gpr));
    FT_P) regfile(pr));
    FT_L (regfile(lit));
    FT_IL (compatible_with (FT_I FT_L));
  }
    SECTION Operation_Format {
    OF_intarith1 (pred FT P) src (FT_I) dest (FT_I));
    OF_intarith2 (pred (FT-P) src (FT_IL FT_I) dest (FT-I));
  }
```

In this example, there are four operation groups that require two operation formats: OF_intarith1, and OF_intarith2. The Operation_Format section provides the register file port requests for each of these operation formats. First, the datapath synthesizer translates operation group port requests to FU port requests based on the mapping of operation groups to FU instances decided earlier.

There are alternative ways to map operation group port requests to FU port requests. One approach is to map all opgroup port requests to corresponding FU port requests and then have one RF port request per FU port request. In an alternative approach, each opgroup occurrence is mapped to its own RF port request. In this case, the datapath synthesizer applies affinity allocation of RF port requests to FU port requests. Affinity allocation is described further below.

Next, the datapath synthesizer builds a conflict graph where the nodes are the resource requests (e.g., register file port requests) and the edges in the graph are conflict relationships among the requests. In the implementation, the datapath synthesizer builds a concurrency matrix between each of the FU port requests, while taking into account the exclusion relationships among the operation groups. The rows and columns of the concurrency matrix correspond to the port requests, and each element in the matrix corresponds to a pair of port requests. At each element, the matrix stores a binary value reflecting whether or not there is a resource conflict between the pair of port requests.

The next step is to allocate the read and write ports as shown in steps 56 and 58. To allocate these ports, the datapath synthesizer executes a resource allocation algorithm. In particular, the resource allocation algorithm in the current implementation uses a technique based on graph coloring to allocate the minimum number of read/write ports for each register file that will satisfy all connection requests.

Pseudo code for this resource allocation algorithm is listed below.

```
ResourceAlloc(nodeRequests, conflictgraph)
    // compute resource request for each node + neighbors
    foreach (node E conflictgraph) do
        Mark(node) = FALSE;
        TotalRequest(node) = Request(node) +
           Request(NeighborsOf(node));
        AllocatedRes(node) = empty
    endforeach
    //sort nodes by increasing remaining total resource request
    //compute upper-bound on resources needed by allocation
    resNeeded = 0; Stack = EMPTY;
    for (k from 0 to NumNodes(conflictGraph)) do
        find (minnode ∈ unmarked nodes) such that
        TotalRequest (minNode) is minimum;
        Mark(minNode) = TRUE;
        push(minNode, Stack);
        resneeded = max (resneeded, TotalRequest(minNode));
        foreach (nhbr ∈ NeighborsOf(minNode)) do
           TotalRequest(nhbr) -= Request(minNode);
        Endforeach
        endfor
    //process nodes in reverse order (i.e., decreasing total
    request)
    while (Stack is not EMPTY) do
        node = pop(Stack);
        AllResources = (0 . . . resNeeded-1);
        // available resources are those not already allocated to
        any neighbor
        AvailableRes(node) = AllResources -
        AllocatedRes(NeighborsOf(node));
        //select requested number of port requests from available
        ports
        //according to one of several heruristics
        AllocatedRes(node) = Choose Request(node) resources from
        AvailableRes(node)
           H1: Contiguous Allocation
           H2: Affinity Allocation
        end
    return resneeded;
```

The allocation heuristic is a variant of Chaitin's graph coloring register allocation heuristic. See, Chaitin, G., J., *Register Allocation & Spilling Via Graph Coloring*, ACM 1982. Chaitin made the following observation. Suppose G is a conflict graph to be colored using k colors. Let n be any node in G having fewer than k neighbors, and let G' be the graph formed from G by removing node n. Now suppose there is a valid k-coloring of G'. This coloring can be extended to form a valid k-coloring of G by simply assigning to n one of the k colors not used by any neighbor of n; an unused color is guaranteed to exist since n has fewer than k neighbors. Stated another way, a node and its w neighbors can be colored with w+1 or fewer colors.

In the current implementation, each FU port is viewed as an independent resource requestor, requesting a single resource, namely, a register file data port. In an alternative implementation, each FU could request multiple ports for a given register file that correspond to the various operation groups mapped to that FU. In that case, these multiple requests would be defined to have affinity between them to allow them ID to be preferably allocated to the same register file port. This would reduce the interconnect needed to connect the FU port to the RF ports.

In the above pseudocode, the total resource request for a node and its neighbors is computed by the first loop. The heuristic repeatedly reduces the graph by eliminating the node with the current lowest total resource request (node plus remaining neighbors). At each reduction step, we keep track of the worst-case resource limit needed to extend the coloring. If the minimum total resources required exceeds the current value of k, we increase k so that the reduction process can continue. The graph reduction is performed by the second loop. Nodes are pushed onto a stack as they are removed from the graph. Once the graph is reduced to a single node, we begin allocating register ports (resources) to nodes. Nodes are processed in stack order, i.e. reverse reduction order. At each step, a node is popped from the stack and added to the current conflict graph so that it conflicts with any neighbor from the original graph that is present in the current conflict graph. The existing allocation is extended by assigning register ports to satisfy the current node's request, using register ports disjoint from ports assigned to the current node's neighbors. This process is shown in the third loop.

One heuristic used in the implementation favors 'contiguous allocation'. This heuristic simplifies interconnect layout by allocating register ports to contiguous positions. Another heuristic is 'affinity allocation'. The affinity allocation attempts to assign port requests to the same register port coming from same FU port for different operation groups.

The following heuristics pseudo code illustrates affinity allocation. Each node has a set of affinity siblings. The implementation attempts to assign the same port to affinity siblings as follows:

if node is tentatively allocated then
   make tentative allocation permanent, if possible
if node is (still) not allocated then
   try to use a sibling allocation

```
if node is (still) not allocated then {
   allocate contiguously,
   for each sibling of node {
      if sibling is allocated then
         try to use node's allocation in place of existing allocation
      else
         tentatively allocate sibling, using node's allocation
   } // for
}
```

After allocating the register file ports, the datapath synthesizer builds the register files by selecting appropriate register file macrocells from the macrocell database 44 to satisfy the read/write port allocation. The synthesizer selects from a macrocell database individual register file instances (general purpose register files, predicate register files, etc.) each with a number of ports which correspond to the read/write port allocation to build the register file(s) of the machine. It then stores the resultant register file instances as a set of classes in the processor description 32.

As shown in step 62, the datapath synthesizer records the register file to functional unit port allocation as an internal data structure 66. Next, the datapath synthesizer builds the interconnect as shown in step 64. In building the interconnect, the synthesizer selects macrocell instances of wires, buses, muxes, tri-states, etc., so as to satisfy the register file to functional unit port allocation.

Figure 5:
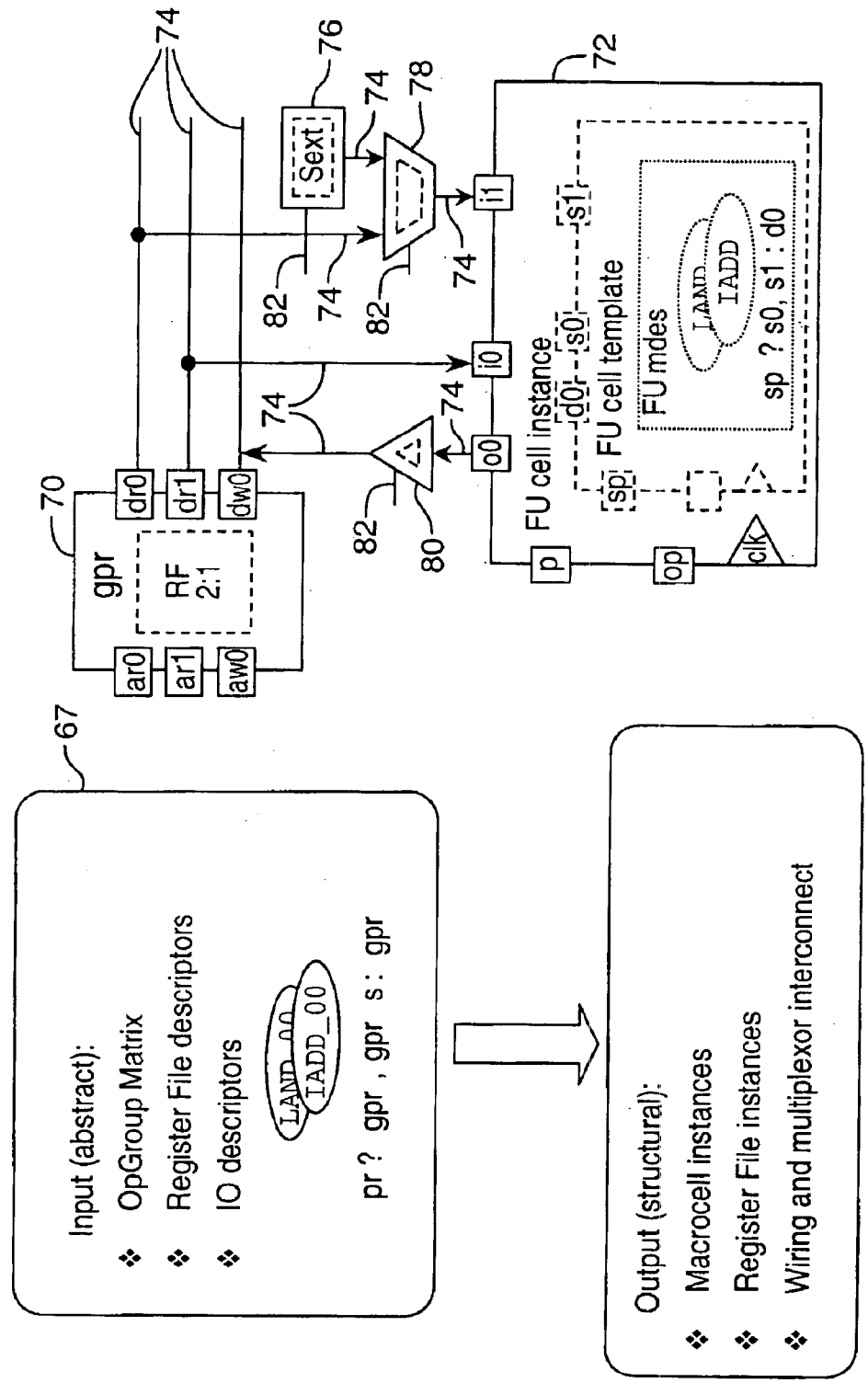
FIG. 5 graphically depicts an input specification and its corresponding datapath design to illustrate that the datapath synthesis process produces a structural description of the datapath from a specification of its operations and the desired instruction level parallelism among them.

The VLIW datapath processing produces a set of C++ classes of functional unit macrocell instances, register file macrocell instances, and interconnect component instances, e.g., wires, muxes, tri-state buffers, etc. FIG. 5 shows an example of the output graphically depicting the datapath synthesis process. In this example, the abstract input 67 specifies operation groups LAND_00 and IADD00. The "pr ? gpr, gpr s :gpr" entry is the operation format for the two operation groups.

General purpose register (gpr) 70 has three control address line inputs ar0, ar1, and aw0, two data inputs dr0 and dr1, and one data output dw0. The gpr provides input to and receives output from a functional unit 72 through interconnects 74 and periphery circuitry, including sign-extend literal 76, multiplexor 78, and tri-state buffer 80. The control inputs 82, which are undefined at this point, control these components. The functional unit 72 comprises a functional unit cell instance, such as an ALU, selected from a standard or user-specified macrocell database.

While FIG. 5 shows instances of only a single register file (gpr) and functional unit cell instance, the actual output of the datapath extraction will typically comprise a variety of register files and FU cell instances.

Generating a Structural Description

The system produces a structural description of the processor datapath at the RTL-level in a standard hardware description language such as VHDL. This description can be linked with the respective HDL component libraries pointed to by the macrocell database and processed further for hardware synthesis and simulation.

Conclusion

While the invention is described in the context of a specific implementation, the scope of the invention is not limited to this implementation. A number of design variations are possible.

One possible variation is the manner in which the ILP constraints are specified. As noted above, the ILP constraints may be specified as exclusion sets, concurrency sets, or some combination of both. The form of other input data structures, such as the register file specification and macrocell library may vary as well. These data structures may be provided in an external file form, such as a textual file (e.g., the ArchSpec which is in a tabular form using the HMDES database language) or in an internal form (e.g., a separate user interface to specify register file data structures and a component-level interface to the standard HDL macrocell databases). The above description provides a number of constructs for specifying an opcode repertoire, the I/O formats of the opcodes and the desired ILP among the operations. However, these constructs are not critical to the implementation of the invention.

The AIR form of the datapath represents only one possible way to specify the output of the datapath design process. Other types of hardware description languages may be used as well, such as VHDL or Verilog. Indeed, the AIR form can be easily translated to one of these external textual formats. The current implementation produces VHDL output.

The programmatic method for selecting functional units employs a process for finding "exclusion cliques." However, it is also possible to use an alternative approach based on concurrency relationships. For example, an alternative approach is to programmatically find sets of concurrent operation group occurrences, and then assign operation group occurrences in the same set to different functional units to ensure that the operations within these groups may be issued concurrently.

The programmatic method for allocating functional unit ports to register file ports may vary as well. The method described above uses a number of heuristics, yet these heuristics may be used alone or in various combinations in alternative implementations.

In view of the many possible implementations of the invention, it should be recognized that the implementation described above is only an example of the invention and should not be taken as a limitation on the scope of the invention. Rather, the scope of the invention is defined by the following claims. We therefore claim as our invention all that comes within the scope and spirit of these claims.

We claim:

1. A method for automatic synthesis of a register file and functional unit-register file interconnect in a processor, based on an input specification of register file types in the processor, specified processor operations, desired instruction level parallelism among specified operations and functional units in the processor, the method comprising:

for each type of register file specified in the processor, establishing a set of read/write port requests between the functional units and each of the register file types;

programmatically computing a resource allocation of register ports in the register file types to read/write port requests, including determining how to share a register port for two or more functional unit ports based on the specification of instruction level parallelism among the specified processor operations; and programmatically synthesizing register files with the allocated read/write ports and interconnects between the functional units and the allocated read/write ports.

2. The method of claim 1 wherein the resource allocation uses a contiguous allocation heuristic that simplifies interconnect layout by allocating register port requests from a functional unit to contiguous register ports.

3. A computer readable medium having computer readable code that when executed causes the computer to perform the steps of the method of claim 1.

4. A method of claim 1 wherein said input specification comprises a desired set of machine operations together with an abstract specification of concurrency and resource sharing constraints.

5. The method of claim 4 wherein a concurrency constraint identifies which operations are allowed to be issued at the same time, while a resource sharing constraint identifies which operations cannot be issued at the same time.

* * * * *